(12) United States Patent
Edelstein et al.

(10) Patent No.: US 9,721,835 B2
(45) Date of Patent: Aug. 1, 2017

(54) MODULATING MICROSTRUCTURE IN INTERCONNECTS

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/965,991

(22) Filed: Dec. 11, 2015

(65) Prior Publication Data

US 2017/0170063 A1    Jun. 15, 2017

(51) Int. Cl.
*H01L 21/768*    (2006.01)

(52) U.S. Cl.
CPC .. *H01L 21/76883* (2013.01); *H01L 21/76802* (2013.01); *H01L 21/76843* (2013.01)

(58) Field of Classification Search
CPC ......... H01L 21/76883; H01L 21/76802; H01L 21/76843
See application file for complete search history.

(56) References Cited

U.S. PATENT DOCUMENTS

| | | |
|---|---|---|
| 6,506,668 B1 | 1/2003 | Woo et al. |
| 6,949,475 B2 | 9/2005 | Lee |
| 7,611,939 B2 | 11/2009 | Mehrotra et al. |
| 7,833,900 B2 | 11/2010 | Leong et al. |
| 7,851,358 B2 | 12/2010 | Wu et al. |
| 7,989,338 B2 | 8/2011 | Zhang et al. |
| 8,420,537 B2 | 4/2013 | Chanda et al. |

(Continued)

FOREIGN PATENT DOCUMENTS

CN    103187361 A    7/2013

OTHER PUBLICATIONS

Coefficients of Linear Thermal Expansion, The Engineering ToolBox, Aug. 17, 2016, pp. 1-3.*

(Continued)

*Primary Examiner* — Whitney T Moore
*Assistant Examiner* — Joseph Galvin, III
(74) *Attorney, Agent, or Firm* — Cantor Colburn LLP; Steven Meyers (57) ABSTRACT

Recrystallization and grain growth of an interconnect metal, such as Cu, is achieved at higher anneal temperatures of 150° C. to 600° C., for example, for short anneal times of five to 180 minutes by forming a metal stress locking layer on the interconnect metal before anneal and chemical-mechanical polishing. The stress locking layer extends the elastic region of the interconnect metal by suppressing atom diffusion to the free surface, resulting in near zero tensile stress at room temperature after anneal. Stress voiding, which creates reliability problems, is thereby avoided. Improved grain size and texture are also achieved. The stress locking layer is removed after anneal by chemical-mechanical polishing or wet etching leaving the metal interconnect with low stress and improved grain size and texture. Annealing can be done in a forming gas or nitrogen gas atmosphere.

17 Claims, 7 Drawing Sheets

(56) References Cited

U.S. PATENT DOCUMENTS

| | | | |
|---|---|---|---|
| 2008/0311739 A1* | 12/2008 | Besling | H01L 21/76834 438/643 |
| 2009/0297759 A1* | 12/2009 | Chanda | H01L 21/76877 428/83 |
| 2011/0003428 A1* | 1/2011 | Sasaki | H01L 27/1225 438/104 |
| 2014/0287577 A1 | 9/2014 | Emesh et al. | |
| 2015/0206840 A1* | 7/2015 | Lin | H01L 23/538 257/734 |

OTHER PUBLICATIONS

Yang, C.C., IEEE Electron Device Letters. Microstructure Modulation in Copper Interconnects; vol. 35, No. 5, (May 2014), 572-574.

\* cited by examiner

| SAMPLE | #1 NO CAP - 100C ANNEAL | #2 NO CAP - 300C ANNEAL | #3 100A TaN CAP - 100C ANNEAL | #4 100A TaN CAP - 300C ANNEAL | #5 300A TaN CAP - 100C ANNEAL | #6 300A TaN CAP - 300C ANNEAL |
|---|---|---|---|---|---|---|
| 25C | 4.7 | 4.7 | 9.1 | 9.5 | 8.3 | 9.1 |

FIG. 6

MODULATING MICROSTRUCTURE IN INTERCONNECTS

BACKGROUND

The present invention relates to electronic interconnect structures and, more particularly, to methods and structures for making the microstructure in metallization more effective and reliable as an electronic interconnect.

It is well known that the microstructure in metallization plays one of the more critical roles in dictating the reliability of electronic interconnects, including the electromigration and stress voiding behaviors. For example, it is known that large columnar or bamboo-type grain structures in copper and aluminum interconnects, with grain boundaries across the interconnect film thickness and line width, are the most favorable grain structures in terms of electromigration stability and reliability. This is thought to be due to the fact that grain boundaries are the fast diffusion paths during electromigration, and having grain boundaries oriented perpendicular to the electromigration flux significantly slows down the mass transport.

It is known that desirable grain structure, and particularly grain growth, can be achieved by annealing the metallization during electronic device fabrication. For example, annealing electroplated copper (Cu) before standard chemical-mechanical polishing (CMP) of the device to planarize the copper, typically may be performed at 100° C. for around an hour. Such annealing promotes a recrystallization and grain growth in the Cu structure, wherein grain growth lowers energy by reducing grain boundary area, while recrystallization lowers energy by eliminating mechanically strained grains.

Since recrystallization and grain growth are both thermally activated processes involving atomic diffusion, it is desirable to anneal at higher temperatures so as to reduce the anneal process time. However, it has been found that high temperature anneal results in reliability exposure due to stress voiding. In this regard, it is noted that the impact of annealing the metal film on stress voiding reliability is due to thermal stress generation and relaxation. It is understood that because of the mismatch in thermal expansion coefficients between the metal film and the surrounding dielectric structure and substrate, significant thermal stress is induced from temperature change.

Accordingly, when annealing a metal at elevated temperatures, such as around 150° C. and above, the metal film is subjected to compressive stress which tends to relax by atomic diffusion on the surface and grain boundaries, and thus forms hillocks on the free surface. As a result, it is understood that the metal film is subjected to large tensile stress when it is cooled to lower temperatures resulting in stress voids at device operating temperatures.

SUMMARY

In one aspect of the present invention, a method for forming an electrical interconnect structure, comprises patterning a dielectric substrate to form a trench feature, a via feature, or combinations thereof; lining the patterned dielectric layer with a conductive liner layer; forming a metal interconnect layer on the conductive liner layer, wherein the metal interconnect layer is formed of a metal selected from the group consisting of W, Al, Ag, Au, and alloys thereof; forming a metal stress locking layer directly on the metal interconnect layer to lock stress and extend an elastic region of the metal during annealing so that relaxation by surface diffusion is reduced; annealing the metal interconnect layer at an elevated temperature for a period of time effective to recrystallize the metal interconnect layer; removing the metal stress locking layer; and removing portions of the metal interconnect layer and the conductive liner layer apart from the trench and/or via features.

In other aspects of the present invention, the method for forming an electrical interconnect structure comprises patterning a dielectric substrate to form a trench feature, a via feature, or combinations thereof; lining the patterned dielectric layer with a conductive liner layer, forming a metal interconnect layer on the conductive liner layer, forming a metal stress locking layer directly on the metal interconnect layer to lock stress and extend an elastic region of the metal during annealing so that relaxation by surface diffusion is reduced, wherein the metal stress locking layer is a metal selected from the group consisting of Al, Ni, Au, Ag, Rh, Fe, and alloys thereof; annealing the metal interconnect layer at an elevated temperature for a period of time effective to recrystallize the metal interconnect layer; removing the metal stress locking layer; and removing portions of the metal interconnect layer and the conductive liner layer exclusive from the trench and/or via features.

in another aspect of the present invention, the method for forming an electrical interconnect structure comprises patterning a dielectric substrate to form a trench feature, a via feature, or combinations thereof; lining the patterned dielectric layer with a conductive liner layer; forming a metal interconnect layer on the conductive liner layer; forming a metal stress locking layer directly on the metal interconnect layer to lock stress and extend an elastic region of the metal during annealing so that relaxation by surface diffusion is reduced; annealing the metal interconnect layer in a forming gas or a nitrogen gas atmosphere at an elevated temperature for a period of time effective to recrystallize the metal interconnect layer; removing the metal stress locking layer; and removing portions of the metal interconnect layer and the conductive liner layer exclusive from the trench and/or via features.

DETAILED DESCRIPTION OF THE DRAWINGS

Figure 1A:
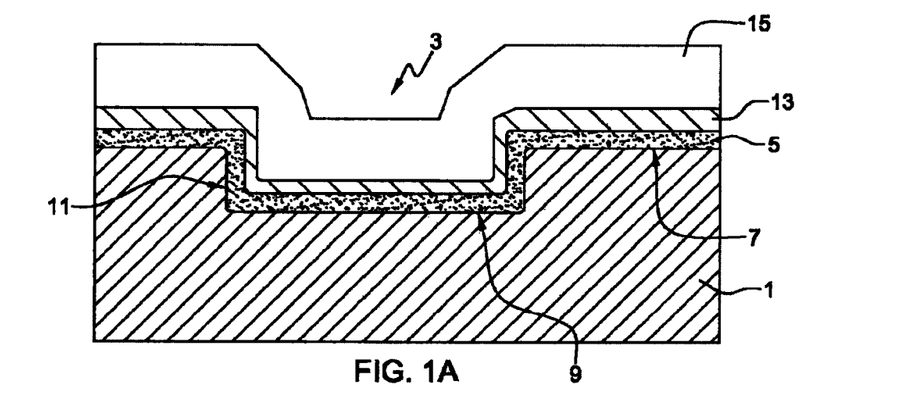
FIGS. 1A-1C show the steps for a conventional metallization fabrication process employing annealing, such as, that employed in annealing Cu metallization.
Figure 1B:
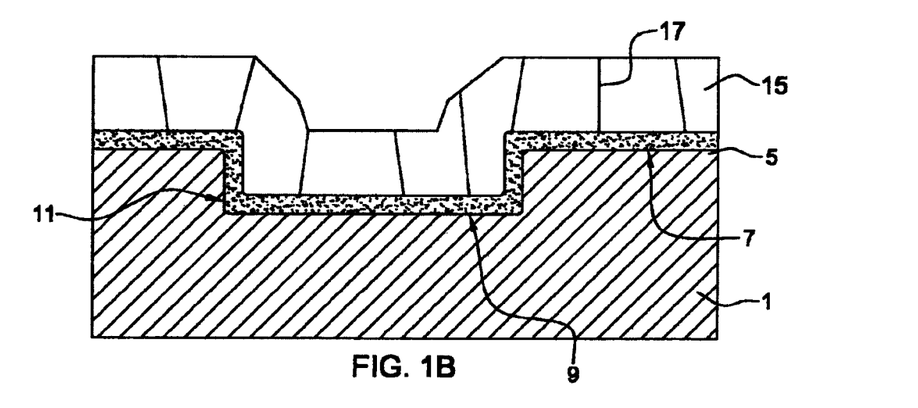
Figure 1C:
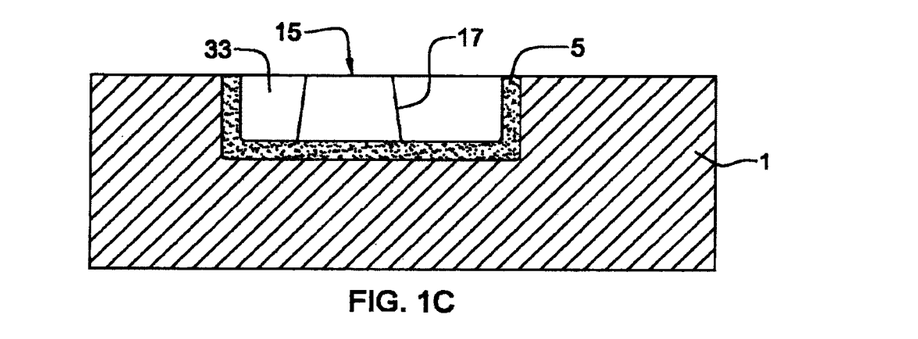

With reference to FIGS. 1A-1C, there is shown the conventional steps employed in fabricating metal interconnects, such as copper (Cu), tungsten (W), aluminum (Al), silver (Ag), gold (Au), cobalt (Co), ruthenium (Ru), rhodium (Rh), and alloys thereof, and employing an anneal step to promote grain growth. The annealing step is normally undertaken before the chemical mechanical polishing (CMP) step and is typically performed at around 100° C. for one hour.

As shown in FIG. 1A, a layer of dielectric material 1, such as semiconductor material, is etched to form a trench 3. A liner 5 of conductive material is then conformally deposited on the surface 7 of dielectric layer 1 and in trench 3, including bottom surface 9 and sidewalls 11 of the trench. A seed layer 13 of Cu, for example, is then similarly conformally deposited over liner 5 and a Cu layer 15 is then conformally electroplated onto the seed layer. It should be understood that the relative thicknesses shown are not to scale. Moreover, it should be apparent that the dielectric layer may be patterned to include trenches, vias, and combinations thereof.

In FIG. 1B, Cu layer 15 is annealed, typically for around one hour at around 100° C. As is understood, annealing causes Cu recrystallization and grain growth. Thus, as shown in FIG. 1B, large grain size with columnar or bamboo-type boundaries 17 are obtained by annealing with the grain boundaries generally perpendicular to the plane of the Cu layer such as to be oriented across the layer thickness and line width. As shown in FIG. 1C, after the annealing step, Cu layer 15 and liner 5 are etched back, for example, by CMP to planarize the top surface of semiconductor layer 1.

Figure 2A:
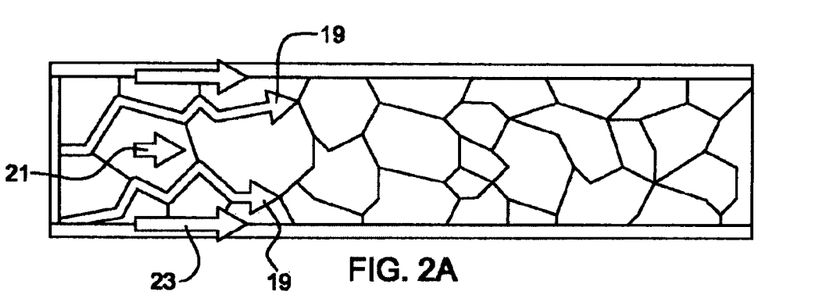
FIGS. 2A-2B depict grain structures as might be found in annealed aluminum (Al) or Cu.
Figure 2B:
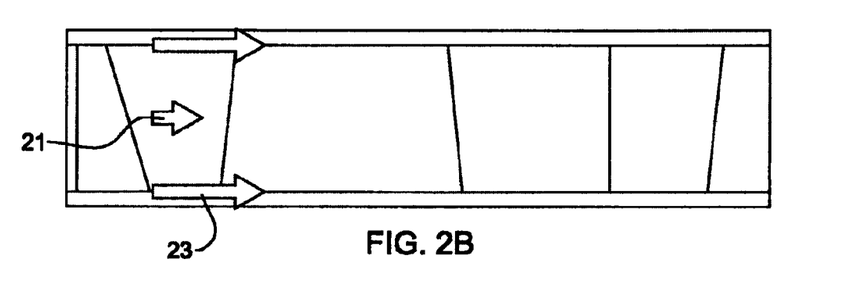

FIG. 2A depicts grain structure as may be found in Cu or Al, for example. The smaller multiple grain structure shown in FIG. 2A provides multiple grain boundaries that act as fast diffusion paths during electromigration. This is shown by arrows 19 in FIG. 2A. As shown in FIG. 2B, the layer of columnar or bamboo-type grain structure, with grain boundaries oriented perpendicular to the electromigration flux, act advantageously to slow down the mass transport. The diffusion paths of FIG. 2B are thus limited to lattice diffusion path 21 and interface diffusion paths 23.

Since recrystallization and grain growth by annealing are both a thermally activated process involving atomic diffusion, annealing at a higher temperature for a shorter time could achieve the desired recrystallization and grain growth and also save process time. However, the higher temperature employed in using this anneal approach results in reliability exposure due to stress voiding.

Stress voiding is a result of thermal stress generation and relaxation. In this regard, it is thought that the mismatch in thermal expansion coefficient between the metal film, such as a Cu film, and the surrounding dielectric and substrate creates significant thermal stress, induced from temperature change. Annealing at elevated temperatures, such as around 300° C. and above, causes compressive stress to be induced upon the metal film. The compressive stress tends to relax by atomic diffusion on the surface and grain boundaries and this diffusion acts to form hillocks on the free surface. As a result, the metal film is under large tensile stress when cooled to lower temperatures.

Figure 3A:
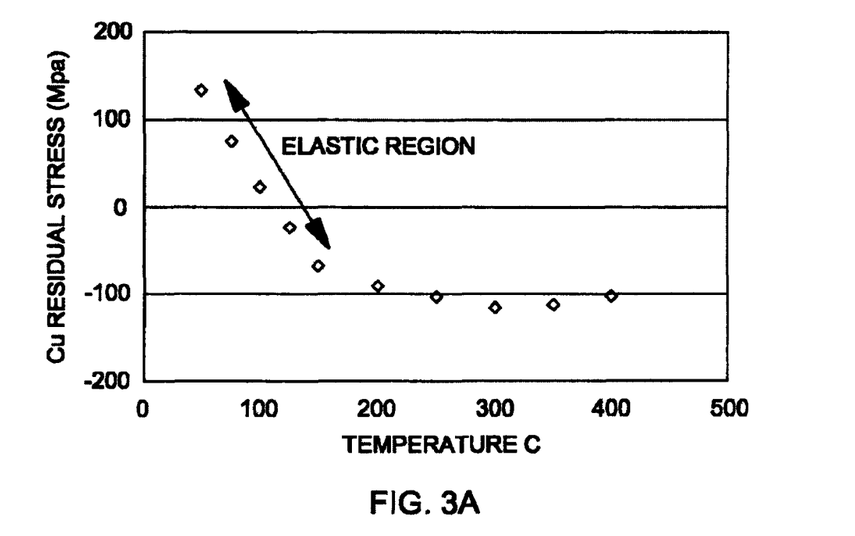
FIGS. 3A-3B show Cu stress as a function of thermal history for conventional annealing and for annealing with a stress locking cap, in accordance with the present invention.

FIG. 3A shows Cu residual stress as a function of thermal history using conventional annealing, as described in prior art FIGS. 1A-IC. Residual stress, in Mega Pascals (MPa), was measured by X-ray diffraction and taken as a function of temperature. Compressive stress falls within the negative MPa values while tensile stress falls within the positive MPa values.

As shown in FIG. 3A, the elastic region of the Cu is limited. The Cu metallization behaves elastically only up to about 150° C. with the maximum compressive stress attainable being about 110 MPa. The latter value is limited by stress relaxation at the elevated temperatures.

Figure 3B:
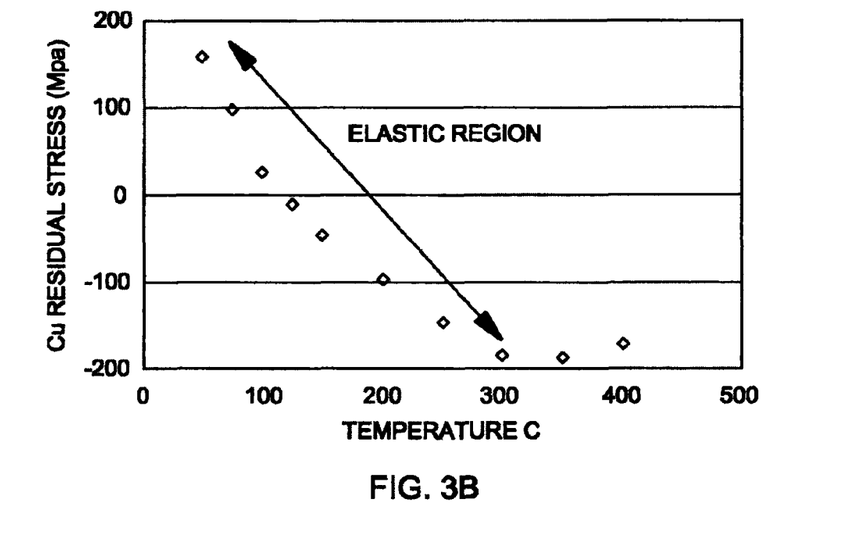

FIG. 3B shows the same Cu arrangement as tested in FIG. 3A with a stress locking layer or cap of tantalum nitride (TaN) formed on the Cu in accordance with U.S. Pat. No. 8,420,537, which is incorporated herein by reference in its entirety. As can be seen, the elastic region is considerably extended. With the stress locking layer over the Cu, the elastic region extends up to about 300° C. until a significant plastic deformation occurs limiting the elasticity. The maximum compressive stress that the Cu film can sustain is almost 200 MPa. Thus, it is clear that the stress locking layer is effective in promoting the elastic response in the plated Cu metallization, as well as extending the compressive yield point at elevated temperatures. The results are desirable to avoid stress hysteresis during pre-CMP annealing, and act to reduce tensile stress buildup at room temperature after anneal. The stress locking layer thus acts to reduce stress relaxation at elevated annealing temperatures. As a result, the tensile stress at lower use temperatures, such as device operating temperatures, is reduced thereby preventing stress voiding. For example, at 100° C. device operating temperature, stresses ranging from slightly compressive to zero MPa are possible. At room temperatures, stresses less than 100 MPa are obtained.

Accordingly, the results show that recrystallization and grain growth can be accelerated at higher pre-CMP annealing without creating stress voiding reliability problems. In this regard, voiding in metal interconnects, caused by high tensile stress, eventually causes resistance increase and electrical opens in the interconnect.

Figure 4A:
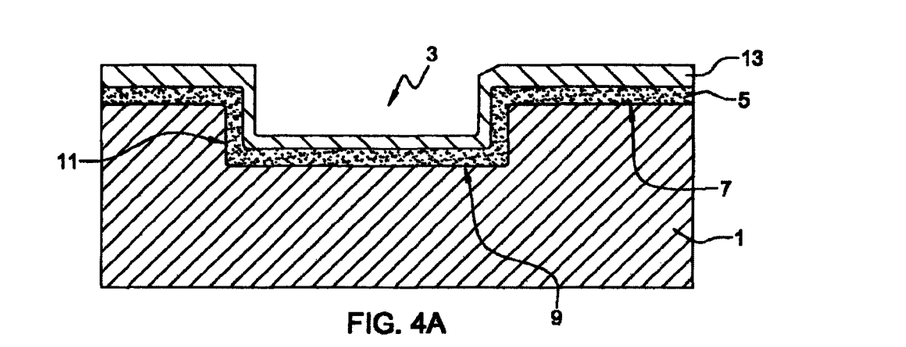
FIGS. 4A-4E show the processing steps for fabricating metallization, such as Cu metallization, with annealing that employs a stress locking cap layer, in accordance with the present invention.
Figure 4B:
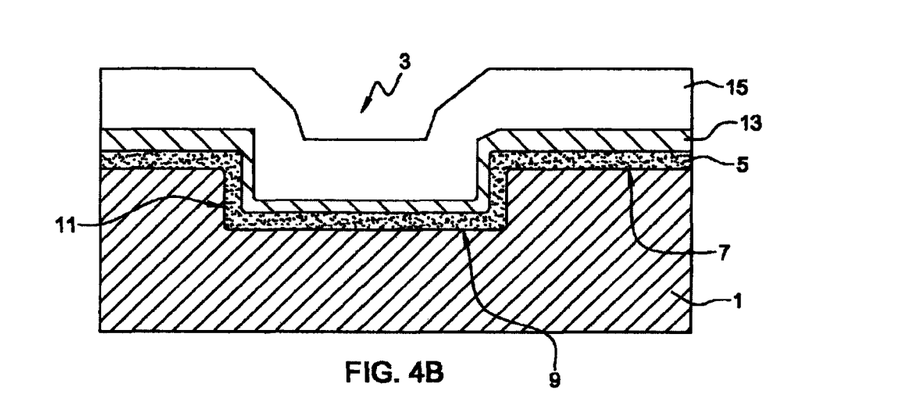

FIGS. 4A-4E show the metallization fabrication process with the addition of a stress locking layer, also referred herein as the stress capping layer. FIGS. 4A-4B involve essentially the same process as previously described with regard to prior art FIG. 1A, wherein like parts or structures are shown with like reference characters. The metal interconnect layer 15 may include any one of copper (Cu), tungsten (W), aluminum (Al), silver (Ag), gold, (Au), cobalt (Co), ruthenium (Ru), rhodium (Rh), and alloys thereof. In one embodiment, the metal interconnect is selected from the group consisting of W, Al, Ag, Au, and alloys thereof. In another embodiment, the metal interconnect layer is Al.

Figure 4C:
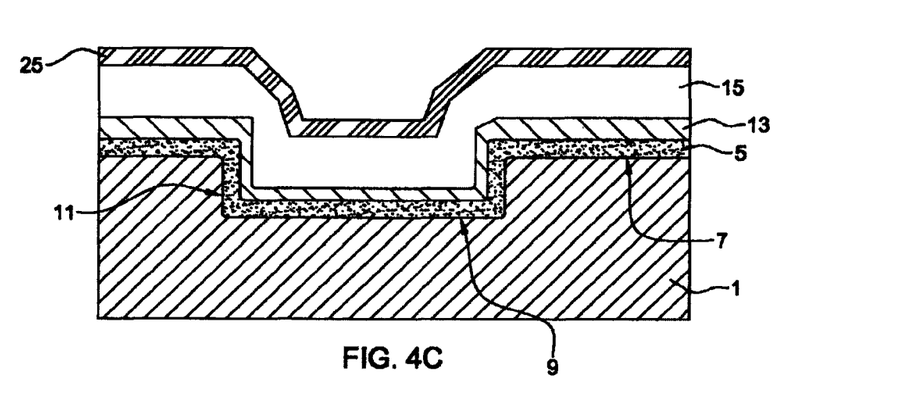

FIG. 4C shows the process step wherein a metal stress locking layer or cap 25 is formed on the metal interconnect layer 15. The stress locking layer may be any one of Al, nickel (Ni), Au, Ag, Rh, iron (Fe), Co, W, Ru, Ta, Ti, alloys thereof, and mixtures thereof. In one embodiment, the metal stress locking layer is a metal selected from the group consisting of Al, Ni, Au, Ag, Rh, and Fe.

The metal stress locking layer 25 may be deposited by chemical-vapor deposition (CVD), physical vapor deposition (PVD), atomic layer deposition (ALD), plating, sputtering or any other desired deposition technique, as is well understood by those skilled in the art. The metal stress locking layer thickness may range between 1 nm and 100 nm. For adhesion enhancement to Cu, an alloy or mixture comprising Ti may be added to the metal stress locking layer composition.

Co-containing materials may also be added to the metal stress locking layer composition, including, for example, may include elemental Co alone or elemental Co and at least one of nitrogen (N), phosphorus (P), boron (B), W, Mo and Re. Thus, the metal stress locking layer 25 may further comprise Co, cobalt phosphide (CoP), cobalt boride (CoB) or CoWP.

Figure 4D:
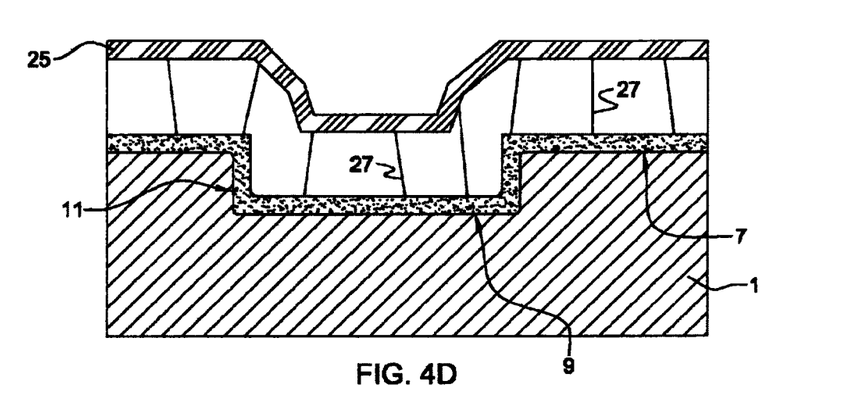

As shown in FIG. 4D, with the metal stress locking layer 25 in place, the structure shown may be subjected to an annealing step, whereby the metallic interconnect material is annealed to cause recrystallization and grain growth. Desired recrystallization and grain growth may generally be achieved by heating the metallic interconnect material between about 80° C. and 600° C. for about five to about one hundred eighty minutes. In one embodiment, annealing is done in an atmosphere comprising forming gas ($N_2$ and $H_2$) or $N_2$ gas. The resulting grain growth produces grain size across the full thickness of the layer or film with the orientation of the grain boundaries being generally perpendicular to the plane of the Cu layer or film and, thus, the electromigration flux path or current path. Grain size of 2 μm or greater may be obtained by the relatively shorter annealing process.

Figure 4E:
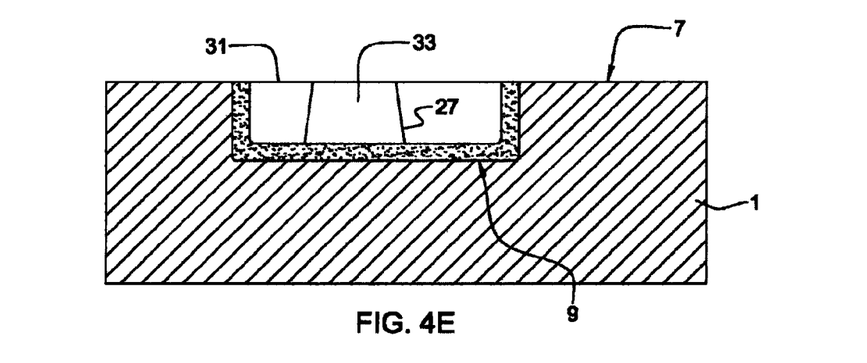

As shown in FIG. 4E, the stress locking layer 25, and portions of the metal interconnect layer 15 and liner layer 5 (also referred to as the metal overburden) overlaying semiconductor surface 7 are removed via a planarization process leaving interconnect Cu line or film 31 with columnar or bamboo-type grains 33 having boundaries 27 across the full thickness of the line. The planarization process may include CMP or a wet etching process using dielectric layer 1 as an etch stop.

An exemplary wet etch process for removing the stress locking layer 25 etching with ammonium hydroxide-hydrogen peroxide-water mixtures, and tetramethylammonium hydroxide (TMAH)-hydrogen peroxide-water mixtures, and mixtures of the above with HF, $H_2SO_4$, $HNO_3$, HCl or the like.

Figure 5:
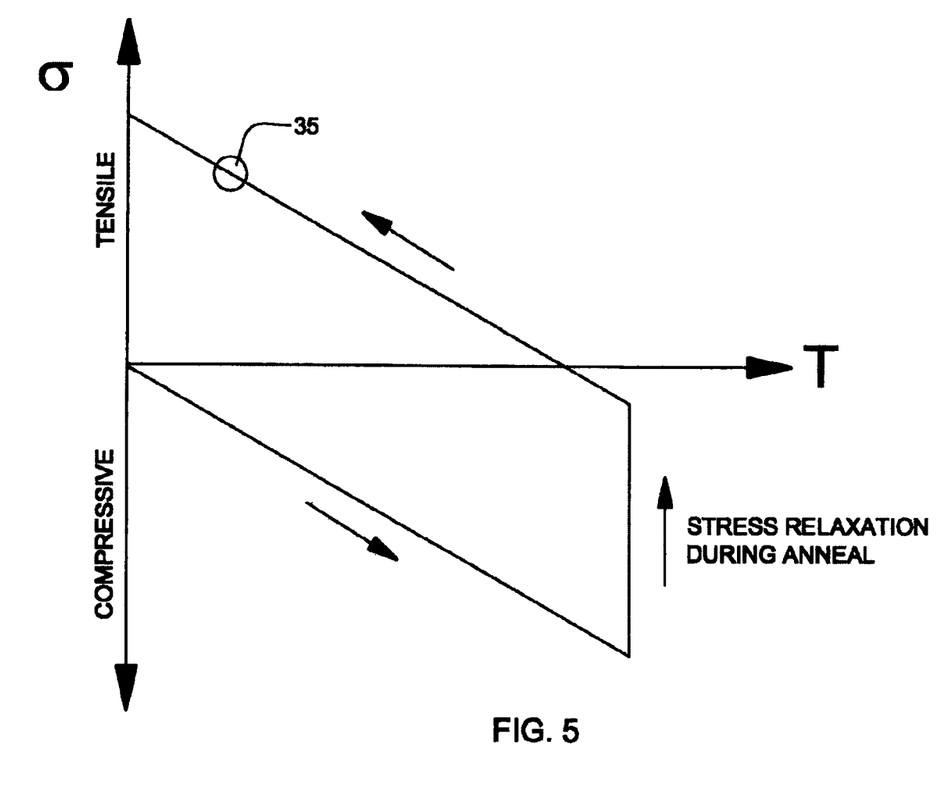
FIG. 5 shows a diagram of stress evolution in thermal history.

FIG. 5 shows a general plot of stress evolution as a function of thermal history. This plot represents stress evolution in conventional arrangements where no stress locking layer is present. As shown, starting at low or zero stress, as heat is applied during anneal, the annealed metal, such as Cu, is subjected to compressive force until the Cu stress relaxation point is reached and surface diffusion starts. This is shown by the vertical line extending upwardly until sufficient stress is relieved and the cooling process takes stress back to room temperature and a point of significant tensile stress. The point 35 is what might be the normal operating temperature of a device using the Cu interconnect. This point is typically around 100° C. and, as can be seen, it is a point where significant tensile stress exists.

By using the stress locking layer, in accordance with the present invention, the elastic region of the Cu is considerably extended to at least 300° C., as shown in FIGS. 3A-3B, such that stress relaxation by surface diffusion is substantially reduced, if not avoided. As a result, the compressive stress through annealing, as shown in FIG. 5, is allowed to extend downwardly to greater compressive stress values without stress relaxation. If any stress relaxation occurs, as in the case without the stress locking layer and shown by the upward extension of the thermal history, it is slow and minimal thus allowing the tensile stress created upon cooling to be near zero.

Figure 6:
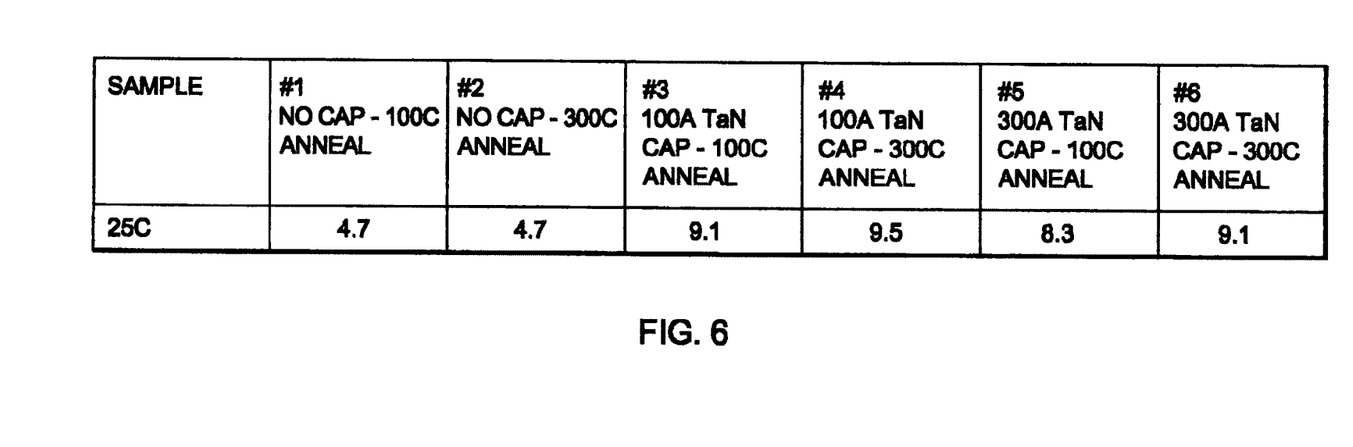
FIG. 6 shows texture values of several samples of annealing Cu with and without the stress locking cap layer.

FIG. 6 shows the fiber or grain texture results of six samples of annealed Cu, both with and without stress caps. The fiber texture values shown represent [111] fiber texture. Measurements were made by X-ray diffraction at 25° C. X-ray intensity for each sample was measured from the (111) crystallographic plane and the (200) crystallographic plane and the results were used to form a ratio representing texture value. A larger ratio number indicates there are more (111) crystals in the Cu film than (200) plane, and thus a higher [111] texture. Higher [111] texture is more desirable for electromigration reliability.

All samples show some [111] texture, which is the preferred alignment of crystals with (111) planes parallel to the surface. However, as can be seen, the last four capped samples show a substantial increase in [111] texture over the two non-capped samples. TaN was used for the stress cap. As can also be seen, the two samples within the four capped samples that were annealed at 300° C. for sixty minutes show some improvement in texture over the two samples that were annealed at 100° C. for sixty minutes. Conversely, there was no difference in texture values between the two non-capped samples, one of which was annealed at 100° C. for sixty minutes and the other at 300° C. for sixty minutes.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method for forming an electrical interconnect structure, comprising:
    patterning a dielectric substrate to form a trench feature, a via feature, or combinations thereof;
    lining the patterned dielectric layer with a conductive liner layer;
    forming a metal interconnect layer on the conductive liner layer, wherein the metal interconnect layer is W and alloys thereof;
    forming a metal stress locking layer directly on the metal interconnect layer to lock stress and extend an elastic region of the metal during annealing so that relaxation by surface diffusion is reduced, wherein the metal stress locking layer is a metal and cobalt or the metal and a cobalt-containing material, wherein the metal is selected from the group consisting of Al, Ni, Au, Ag, Rh, Fe, and alloys thereof and further comprises;
    annealing the metal interconnect layer at an elevated temperature for a period of time effective to recrystallize the metal interconnect layer;
    removing the metal stress locking layer; and
    removing portions of the metal interconnect layer and the conductive liner layer apart from the trench and/or via features.

2. The method of claim 1, wherein annealing the metal interconnect structure comprises heating the structure at a temperature from 150° C. to 600° C. for about 5 to about 180 minutes.

3. The method of claim 2, wherein annealing is conducted in a forming gas or a nitrogen gas atmosphere.

4. The method of claim 1, wherein removing the metal stress locking layer and the portions of the metal interconnect layer comprises exposing the metal stress locking layer and the portions of the metal interconnect layer to a wet etchant.

5. The method of claim 1, wherein removing the metal stress locking layer and the portions of the metal interconnect layer comprises first exposing the metal stress locking layer to a wet etchant to remove the metal stress locking layer followed by chemically mechanically planarizing to remove the portions of the metal interconnect layer.

6. A method for forming an electrical interconnect structure, comprising:
    patterning a dielectric substrate to form a trench feature, a via feature, or combinations thereof;
    lining the patterned dielectric layer with a conductive liner layer;

forming a metal interconnect layer on the conductive liner layer, wherein the metal interconnect layer is W and alloys thereof;

forming a metal stress locking layer directly on the metal interconnect layer to lock stress and extend an elastic region of the metal during annealing so that relaxation by surface diffusion is reduced, wherein the metal stress locking layer is a metal and cobalt or the metal and a cobalt-containing material, wherein the metal is selected from the group consisting of Al, Ni, Au, Ag, Rh, Fe, and alloys thereof;

annealing the metal interconnect layer at an elevated temperature for a period of time effective to recrystallize the metal interconnect layer;

removing the metal stress locking layer; and removing portions of the metal interconnect layer and the conductive liner layer exclusive from the trench and/or via features.

7. The method of claim 6, wherein the metal interconnect layer is formed of a metal selected from the group consisting of Cu, W, Al, Ag, Au, Co, Ru, Rh, and alloys thereof.

8. The method of claim 6, wherein annealing the metal interconnect structure comprises heating the structure at a temperature from 150° C. to 600° C. for about 5 to about 180 minutes.

9. The method of claim 8, wherein annealing is in an atmosphere comprising forming gas or nitrogen gas.

10. The method of claim 6, wherein removing the metal stress locking layer and the portions of the metal interconnect layer comprises exposing the metal stress locking layer and the portions of the metal interconnect layer to a wet etchant.

11. The method of claim 6, wherein removing the metal stress locking layer and the portions of the metal interconnect layer comprises first exposing the metal stress locking layer to a wet etchant followed by chemically mechanically planarizing to remove the portions of the metal interconnect layer.

12. A method for forming an electrical interconnect structure, comprising:

patterning a dielectric substrate to form a trench feature, a via feature, or combinations thereof;

lining the patterned dielectric layer with a conductive liner layer;

forming a metal interconnect layer on the conductive liner layer, wherein the metal interconnect layer is W and alloys thereof;

forming a metal stress locking layer directly on the metal interconnect layer to lock stress and extend an elastic region of the metal during annealing so that relaxation by surface diffusion is reduced, wherein the metal stress locking layer is a metal and cobalt or the metal and a cobalt-containing material, wherein the metal is selected from the group consisting of Al, Ni, Au, Ag, Rh, Fe, Co, W, Ru, Ta, Ti, alloys thereof, and mixtures thereof;

annealing the metal interconnect layer in a forming gas or a nitrogen gas atmosphere at an elevated temperature for a period of time effective to recrystallize the metal interconnect layer;

removing the metal stress locking layer; and removing portions of the metal interconnect layer and the conductive liner layer exclusive from the trench and/or via features.

13. The method of claim 12, wherein annealing the metal interconnect structure comprises heating the structure at a temperature from 150° C. to 600° C. for about 5 to about 180 minutes.

14. The method of claim 12, wherein the metal interconnect layer is formed of a metal selected from the group consisting of Cu, W, Al, Ag, Au, Co, Ru, Rh, and alloys thereof.

15. The method of claim 12, wherein removing the metal stress locking layer and the portions of the metal interconnect layer comprises exposing the metal stress locking layer and the portions of the metal interconnect layer to a wet etchant.

16. The method of claim 12, wherein removing the metal stress locking layer and the portions of the metal interconnect layer comprises first exposing the metal stress locking layer to a wet etchant followed by chemically mechanically planarizing to remove the portions of the metal interconnect layer.

17. The method of claim 16, wherein the wet etchant comprises ammonium hydroxide-hydrogen peroxide-water mixtures, tetramethylammonium hydroxide (TMAH)-hydrogen peroxide-water mixtures, and mixtures thereof with HF, $H_2SO_4$, $HNO_3$, or HCl.

* * * * *